(12) United States Patent
Masse et al.

(10) Patent No.: US 10,536,124 B1
(45) Date of Patent: Jan. 14, 2020

(54) POWER AMPLIFIER MODULE USING PHASE-CHANGE MATERIAL (PCM) RADIO FREQUENCY (RF) SWITCHES AND SELECTABLE MATCHING NETWORKS

(71) Applicant: Newport Fab, LLC, Newport Beach, CA (US)

(72) Inventors: Chris Masse, Irvine, CA (US); Nabil El-Hinnawy, Irvine, CA (US); Gregory P. Slovin, Irvine, CA (US); David J. Howard, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/418,930

(22) Filed: May 21, 2019

Related U.S. Application Data

(63) Continuation-in-part of application No. 16/418,130, filed on May 21, 2019, and a continuation-in-part of
(Continued)

(51) Int. Cl.
| | | |
|---|---|---|
| *H01L 45/00* | (2006.01) | |
| *H03G 3/30* | (2006.01) | |
| *H03H 7/38* | (2006.01) | |
| *H03F 3/193* | (2006.01) | |
| *H03F 3/21* | (2006.01) | |

(52) U.S. Cl.
CPC ........... *H03G 3/3036* (2013.01); *H01L 45/06* (2013.01); *H01L 45/1286* (2013.01); *H03F 3/193* (2013.01); *H03F 3/21* (2013.01); *H03H 7/38* (2013.01)

(58) Field of Classification Search
None
See application file for complete search history.

(56) References Cited

U.S. PATENT DOCUMENTS

| | | |
|---|---|---|
| 9,257,647 B2 | 2/2016 | Borodulin |
| 9,368,720 B1 | 6/2016 | Moon |
| | (Continued) | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.
(Continued)

*Primary Examiner* — Evren Seven
(74) *Attorney, Agent, or Firm* — Farjami & Farjami LLP

(57) ABSTRACT

A power stage includes a power stage amplifier, selectable matching networks, and phase-change material (PCM) radio frequency (RF) switches. Each of the PCM RF switches includes a heating element transverse to a PCM, the heating element approximately defining an active segment of the PCM. A power stage amplifier output is connected to the PCM RF switches. Each of the PCM RF switches is connected to one of the selectable matching networks. A power stage amplifier output is coupled to or decoupled from one of the selectable matching networks by one of the PCM RF switches. In one approach, the power stage is included in a power amplifier module of a communications device. The power amplifier module further includes a bias and match controller that biases the power stage amplifier, and that uses one of the PCM RF switches to couple or decouple the power stage amplifier output.

20 Claims, 4 Drawing Sheets

Related U.S. Application Data application No. 16/161,960, filed on Oct. 16, 2018, and a continuation-in-part of application No. 16/114,106, filed on Aug. 27, 2018, and a continuation-in-part of application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993.

(56) References Cited

U.S. PATENT DOCUMENTS

| | | |
|---|---|---|
| 9,917,104 B1 | 3/2018 | Roizin |
| 2014/0266300 A1* | 9/2014 | Sherwin ............. H03K 19/1736 326/38 |
| 2018/0005786 A1 | 1/2018 | Navarro |

OTHER PUBLICATIONS

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

\* cited by examiner

POWER AMPLIFIER MODULE USING PHASE-CHANGE MATERIAL (PCM) RADIO FREQUENCY (RF) SWITCHES AND SELECTABLE MATCHING NETWORKS

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material,". The present application is also a continuation-in-part of and claims the benefit of and priority to application Ser. No. 16/103,587 filed on Aug. 14, 2018, titled "Design for High Reliability RF Switch Based on Phase-Change Material,". The present application is also a continuation-in-part of and claims the benefit of and priority to application Ser. No. 16/103,646 filed on Aug. 14, 2018, titled "PCM RF Switch Fabrication with Subtractively Formed Heater,". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance,". The present application is further a continuation-in-part of and claims the benefit of and priority to application Ser. No. 16/418,130 filed on May 21, 2019, titled "Radio Frequency (RF) Filtering Using Phase-Change Material (PCM) RF Switches,". The disclosures and contents of all of the above-identified applications are hereby incorporated fully by reference into the present application.

BACKGROUND

Radio frequency (RF) amplification techniques using power amplifier modules may employ impedance matching networks. These power amplifier modules and impedance matching networks may be optimized for a single communication standard (e.g., WLAN), but suffer drawbacks that make them inappropriate for another communication standard (e.g., LTE). In one approach, a tunable matching network is used to match a wider range of impedances. However, tunable matching networks require active control circuits, may have high insertion losses, may be nonlinear, and generally perform worse than optimized but fixed matching networks.

In another approach, a power amplifier module may employ switches for engaging and disengaging various matching networks. Integrating such switches in RF amplification solutions generally results in disadvantageous and significant performance tradeoffs. For example, conventional switches, and conventional techniques used to integrate the switches, introduce significant insertion losses. Especially where a wireless communication standard imposes requirements regarding the strength of an RF signal, these losses can prohibit RF amplification as intended. Further, conventional switches are typically volatile and do not maintain their state during power off. Conventional switches may also be unreliable and vary over time.

Thus, there is need in the art for RF amplification solutions that can be optimized for various selected communication standards with low insertion losses that are also non-volatile and reliable.

SUMMARY

The present disclosure is directed to a power amplifier module using phase-change material (PCM) radio frequency (RF) switches and selectable matching networks, substantially as shown in and/or described in connection with at least one of the figures, and as set forth in the claims.

DETAILED DESCRIPTION

Figure 1:
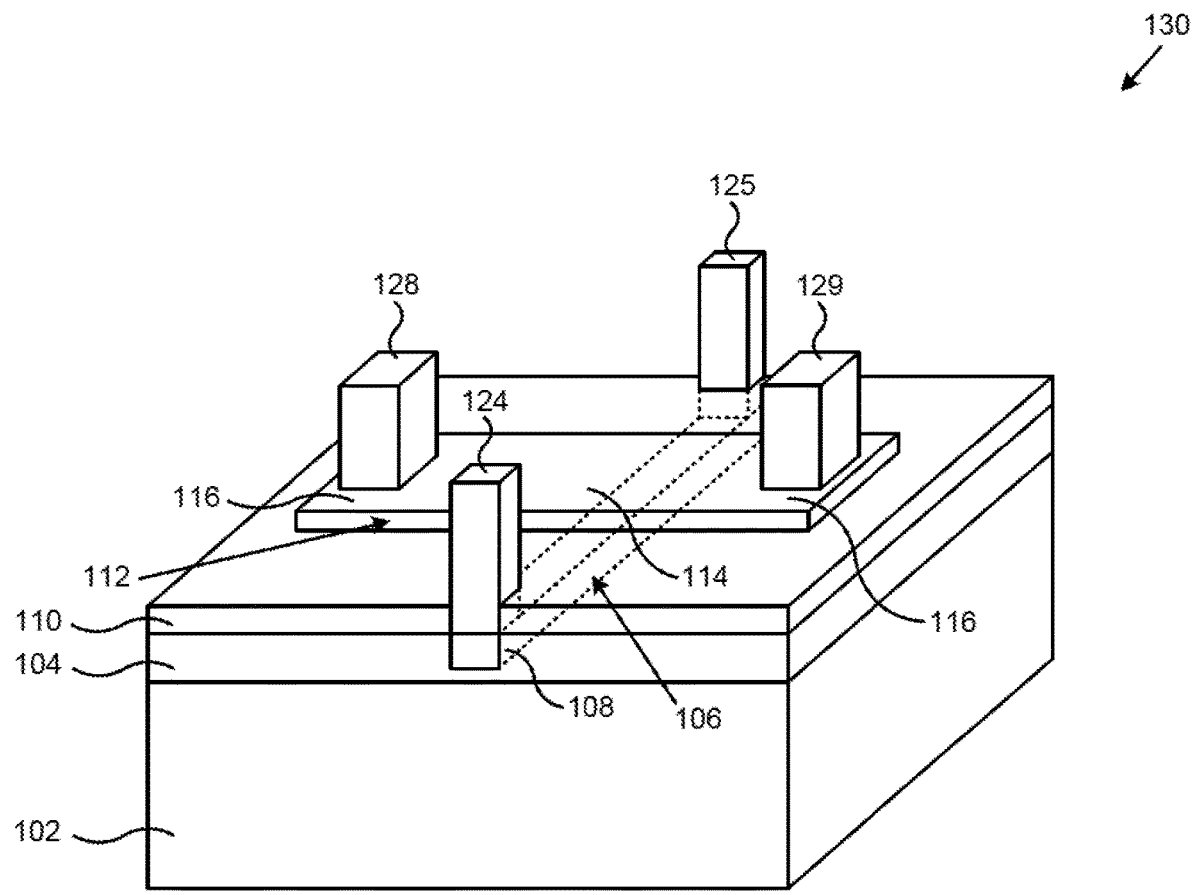
FIG. 1 illustrates a perspective view of a portion of a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

FIG. 1 illustrates a perspective view of a portion of a phase-change material (PCM) radio frequency (RF) switch according to one implementation of the present application. As shown in FIG. 1, PCM RF switch 130 includes substrate 102, lower dielectric 104, heating element 106 having terminal segments 108, thermally conductive and electrically insulating material 110, PCM 112 having active segment 114 and passive segments 116, PCM contacts 128 and 129, and heater contacts 124 and 125. For purposes of illustration, the perspective view in FIG. 1 shows selected structures of PCM RF switch 130. PCM RF switch 130 may include other structures not shown in FIG. 1.

Substrate 102 is situated under lower dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, substrate 102 includes a heat spreader or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 130 is situated above substrate 102 and below thermally conductive and electrically insulating material 110. As shown in FIG. 1, lower dielectric 104 is also adjacent to sides of heating element 106. Lower dielectric 104 extends along the width of PCM RF switch 130, and is also coplanar with the top of heating element 106. Because PCM RF switch 130 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity lower than that of thermally conductive and electrically insulating material 110.

Heating element 106 in PCM RF switch 130 is situated in lower dielectric 104. Heating element 106 also approximately defines active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulse generator (not shown in FIG. 1) that generates voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 130 is situated on top of heating element 106 and lower dielectric layer 104, and under PCM 112 and, in particular, under active segment 114 of PCM 112. Thermally conductive and electrically insulating material 110 ensures efficient heat transfer from heating element 106 toward active segment 114 of PCM 112, while electrically insulating heating element 106 from PCM contacts 128 and 129, PCM 112, and other neighboring structures.

Thermally conductive and electrically insulating material 110 can comprise any material with high thermal conductivity and high electrical resistivity. In various implementations, thermally conductive and electrically insulating material 110 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 110 can be a nugget that does not extend along the width of PCM RF switch 130. For example, thermally conductive and electrically insulating material 110 can be a nugget approximately aligned with heating element 106.

PCM 112 in PCM RF switch 130 is situated on top of thermally conductive and electrically insulating material 110. PCM RF switch 130 utilizes PCM 112 to transfer input RF signals in an ON state and to block input RF signals in an OFF state. PCM 112 includes active segment 114 and passive segments 116. Active segment 114 of PCM 112 is approximately defined by heating element 106. Passive segments 116 of PCM 112 extend outward and are transverse to heating element 106, and are situated approximately under PCM contacts 128 and 129. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM switch 130 to switch between ON and OFF states respectively. Active segment 114 of PCM 112 must be heated and rapidly quenched in order for PCM RF switch 130 to switch states. If active segment 114 of PCM 112 does not quench rapidly enough, it will not transform, and PCM RF switch 130 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_Y Te_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 is transverse to PCM 112. Heating element 106 is illustrated with dashed lines as seen through various structures of PCM RF switch 130. Current flowing in heating element 106 flows approximately under active segment 114 of PCM 112.

PCM contacts 128 and 129 in PCM RF switch 130 are connected to passive segments 116 of PCM 112. Similarly, heater contacts 124 and 125 are connected to terminal segments 108 of heating element 106. PCM contacts 128 and 129 provide RF signals to and from PCM 112. Heater contacts 124 and 125 provide power to heating element 106 for generating a crystallizing heat pulse or an amorphizing heat pulse. In various implementations, PCM contacts 128 and 129 and heater contacts 124 and 125 can comprise tungsten (W), copper (Cu), or aluminum (Al). PCM contacts 128 and 129 and heater contacts 124 and 125 can extend through various dielectric layers (not shown in FIG. 1). In one implementation, in order to ensure uniform contact between PCM 112 and PCM contacts 128 and 129, PCM contacts 128 and 129 can extend through a contact uniformity support layer (not shown in FIG. 1) situated on top of PCM 112, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM RF switch 130 has low insertion loss and is able to provide several advantages. First, PCM 112 in the crystalline state has low resistivity, while PCM 112 in the amorphous state has high resistivity. In various implementations, the OFF state resistance ($R_{OFF}$) of PCM RF switch 130 can range from approximately ten kilo-Ohms to approximately one mega-Ohm (10 kΩ–1MΩ), while the ON state resistance ($R_{ON}$) of PCM RF switch 130 can be approximately one Ohm (1Ω) or less.

Second, where an optional contact uniformity support layer is utilized as described above, PCM 112 will remain substantially intact, and PCM contacts 128 and 129 can uniformly contact passive segments 116 of PCM 112. Because the $R_{ON}$ of a PCM RF switch, such as PCM RF switch 130 in FIG. 1, depends heavily on the uniformity of contacts made with PCM 112, the $R_{ON}$ will be significantly lower when an optional contact uniformity support layer is used.

Third, because PCM RF switch 130 includes lower dielectric 104 adjacent to sides of heating element 106, more heat dissipates vertically from heating element 106. Lower dielectric 104 under heating element 106 also performs as a heat valve that biases vertical heat dissipation from heating element 106 toward active segment 114 of PCM 112, rather than toward substrate 102, enabling PCM RF switch 130 to transition between OFF and ON states using even lower power and/or even quicker pulses. Thus, passive segments 116 are subjected to less thermal cycling consequences, and can be spaced more closely to decrease $R_{ON}$, as disclosed in U.S. patent application Ser. No. 16/103,587 filed on Aug. 14, 2018, titled "Design for High Reliability RF Switch Based on Phase-Change Material." The disclosure and content of the above-identified application are incorporated fully by reference into the present application.

Fourth, PCM contacts 128 and 129 can be formed crosswise to heater contacts 124 and 125, further reducing parasitic capacitive coupling. This reduction in parasitic capacitance values of PCM RF switch 130 is disclosed and described in U.S. patent application Ser. No. 16/161,960 filed on Oct. 16, 2018, titled "Phase-Change Material (PCM) Radio Frequency (RF) Switch with Reduced Parasitic Capacitance." The disclosure and content of the above-identified application are incorporated fully by reference into the present application.

In addition to having low insertion loss and the other advantages described above, PCM RF switch 130 is advantageously non-volatile. That is, PCM 112 maintains its crystalline (ON state) or amorphous phase (OFF state) even when power is not supplied to heating element 106. PCM RF switch 130 requires less power than conventional switches when remaining in an ON state. Also, PCM RF switch 130 is resilient to voltage fluctuations in its programming, making PCM RF switch 130 particularly applicable in antenna tuners and other circuits which might experience large voltage fluctuations.

Figure 2:
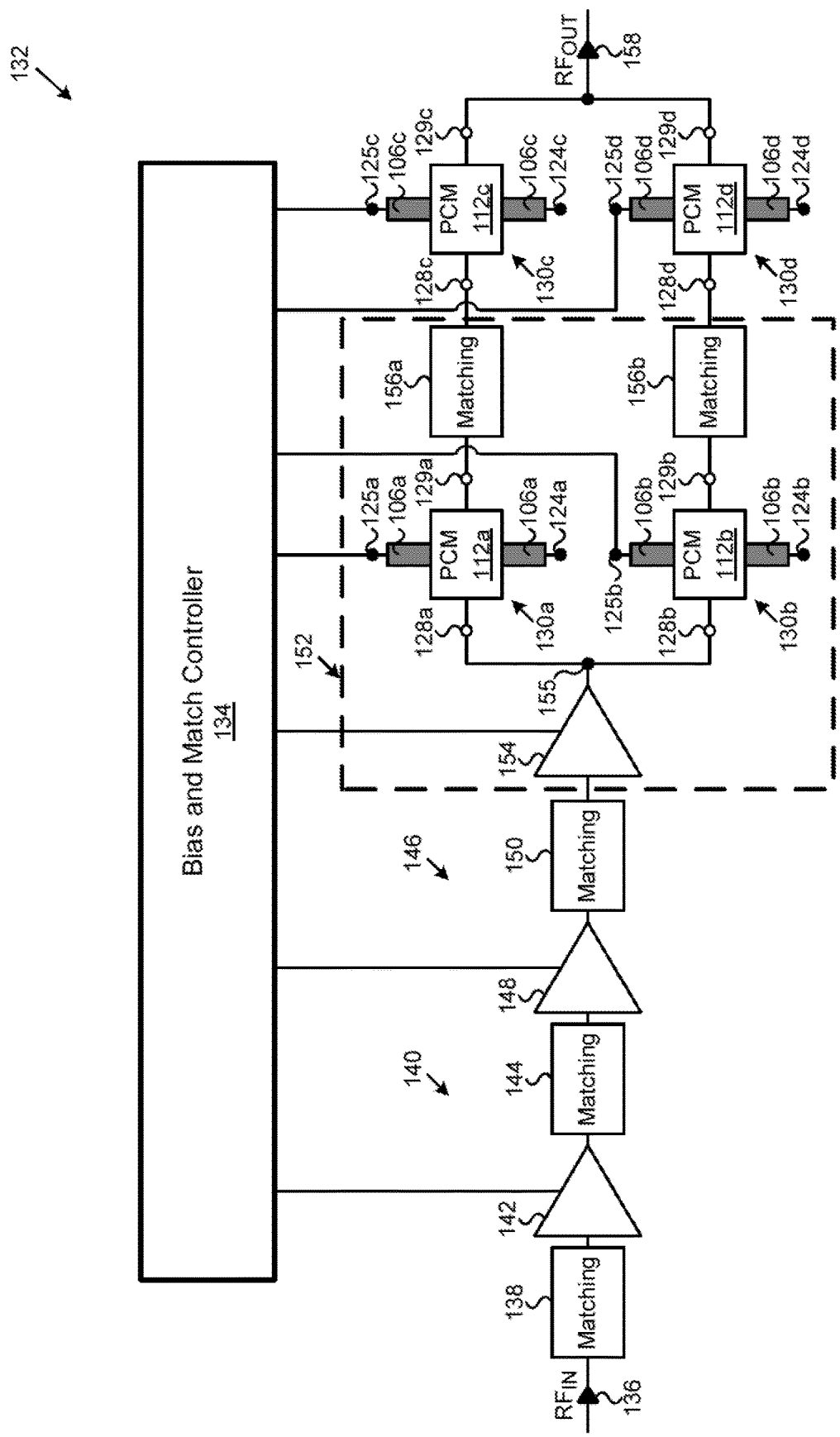
FIG. 2 illustrates a portion of a power amplifier module including a power stage employing PCM RF switches according to one implementation of the present application.

FIG. 2 illustrates a portion of a power amplifier module employing PCM RF switches according to one implementation of the present application. Power amplifier module 132 includes bias and match controller 134, power amplifier module input 136, input matching network 138, pre-driver stage 140 having pre-driver amplifier 142 and pre-driver matching network 144, driver stage 146 having driver amplifier 148 and driver matching network 150, power stage 152 having power stage amplifier 154, PCM RF switches 130a and 130b, and selectable matching networks 156a and 156b, PCM RF switches 130c and 130d, and power amplifier module output 158.

Power amplifier module 132 amplifies an RF signal received at power amplifier module input 136. In one implementation, power amplifier module input 136 can be coupled to a mixer of a transmission chain (not shown in FIG. 2), or to another input source. Power amplifier module input 136 is coupled to input matching network 138. Input matching network 138 is coupled to pre-driver stage 140, and more specifically, to pre-driver amplifier 142. Pre-driver amplifier 142 is coupled to pre-driver matching network 144. Pre-driver matching network 144 is coupled to driver stage 146, and more specifically, to driver amplifier 148. Driver amplifier 148 is coupled to driver matching network 150. Driver matching network 150 is coupled to power stage 152, and more specifically, power stage amplifier 154.

Pre-driver amplifier 142, driver amplifier 148, and power stage amplifier 154 each provide a gain to the RF signal. Pre-driver stage 140 drives driver stage 146, which drives power stage 152. Input matching network 138 provides an impedance match between an input source and pre-driver stage 140. Pre-driver matching network 144 provides an impedance match between pre-driver stage 140 and driver stage 146. Driver matching network 150 provides an impedance match between driver stage 146 and power stage 152.

Power stage amplifier output 155 is coupled to PCM RF switches 130a and 130b. As described further below. PCM RF switches 130a and 130b couple power stage amplifier output 155 to, or decouple power stage amplifier output 155 from, respective selectable matching networks 156a and 156b. PCM RF switch 130a is arranged between power stage amplifier output 155 and selectable matching network 156a. PCM RF switch 130a includes heating element 106a, PCM 112a, PCM contacts 128a and 129a, and heater contacts 124a and 125a. PCM contact 128a is coupled to power stage amplifier output 155. PCM contact 129a is coupled to selectable matching network 156a.

PCM 112a is situated over and transverse to heating element 106a. As described above, heater contacts 124a and 125a provide power to heating element 106a for generating a crystallizing heat pulse or an amorphizing heat pulse for transforming an active segment of PCM 112a between crystalline and amorphous phases, thereby switching PCM RF switch 130a between ON and OFF states respectively. Heater contact 125a is coupled to bias and match controller 134, which can include a pulse generator (not shown in FIG. 2) that generates electrical pulses and provides power to heating element 106a. Heater contact 124a an be coupled to ground (not shown in FIG. 2).

PCM RF switch 130b is arranged between power stage amplifier output 155 and selectable matching network 156b. PCM RF switch 130b includes heating element 106b, PCM 112b, PCM contacts 128b and 129b, and heater contacts 124b and 125b. PCM contact 128b is coupled to power stage amplifier output 155. PCM contact 129b is coupled to selectable matching network 156b. PCM 112b is situated over and transverse to heating element 106b. Heater contact 125b is coupled to bias and match controller 134, which can include a pulse generator (not shown in FIG. 2) that generates electrical pulses and provides power to heating element 106b. Heater contact 124b can be coupled to ground (not shown in FIG. 2). PCM RF switches 130a and 130b in FIG. 2 generally correspond to PCM RF switch 130 in FIG. 1, and may have any implementations or advantages described above.

In power stage 152, PCM RF switches 130a and 130b couple power stage amplifier output 155 to, or decouple power stage amplifier output 155 from, respective selectable matching networks 156a and 156b. That is, power stage amplifier output 155 is coupled to selectable matching network 156a when an active segment of PCM 112a is in a crystalline phase, and power stage amplifier output 155 is decoupled from selectable matching network 156a when an active segment of PCM 112a is in an amorphous phase. Likewise, power stage amplifier output 155 is coupled to selectable matching network 156b when an active segment of PCM 112b is in a crystalline phase, and power stage amplifier output 155 is decoupled from selectable matching network 156b when an active segment of PCM 112b is in an amorphous phase.

Selectable matching network 156a is arranged between PCM RF switch 130a and PCM RF switch 130c. PCM RF switch 130c includes heating element 106c, PCM 112c, PCM contacts 128c and 129c, and heater contacts 124c and 125c. PCM contact 128c is coupled to selectable matching network 156a. PCM contact 129c is coupled to power amplifier module output 158. PCM 112c is situated over and transverse to heating element 106c. Heater contact 125c is coupled to bias and match controller 134, which can include a pulse generator (not shown in FIG. 2) that generates electrical pulses and provides power to heating element 106c. Heater contact 124c can be coupled to ground (not shown in FIG. 2).

Selectable matching network 156b is arranged between PCM RF switch 130b and PCM RF switch 130d. PCM RF switch 130d includes heating element 106d, PCM 112d, PCM contacts 128d and 129d, and heater contacts 124d and 125d. PCM contact 128d is coupled to selectable matching network 156b. PCM contact 129d is coupled to power amplifier module output 158. PCM 112d is situated over and transverse to heating element 106d. Heater contact 125d is coupled to bias and match controller 134, which can include a pulse generator (not shown in FIG. 2) that generates electrical pulses and provides power to heating element 106d. Heater contact 124d can be coupled to ground (not shown in FIG. 2). PCM RF switches 130c and 130d in FIG. 2 generally correspond to PCM RF switch 130 in FIG. 1, and may have any implementations or advantages described above.

PCM RF switches 130c and 130d couple respective selectable matching networks 156a and 156b to, or decouple respective selectable matching networks 156a and 156b from, power amplifier module output 158 of power amplifier module 132. In one implementation, power amplifier module output 158 can be coupled to an antenna of a transmission chain (not shown in FIG. 2), or to another output source.

In the present implementation, selectable matching networks 156a and 156b are configured to be concurrently engaged by two corresponding PCM RF switches. That is, PCM RF switch 130a and corresponding PCM RF switch 130c are turned ON to couple selectable matching network 156a between power stage amplifier output 155 and power amplifier module output 158; PCM RF switch 130a and corresponding PCM RF switch 130c are turned OFF to decouple selectable matching network 156a. Similarly, PCM RF switch 130b and corresponding PCM RF switch 130d are turned ON to couple selectable matching network 156b between power stage amplifier output 155 and power amplifier module output 158; PCM RF switch 130b and corresponding PCM RF switch 130d are turned OFF to decouple selectable matching network 156b.

Bias and match controller 134 is coupled to power stage amplifier 154. Bias and match controller 134 biases power stage amplifier 154 to operate in one of several amplifier classes. For example, bias and match controller 134 can bias power stage amplifier 154 to operate in class A, class AB, class E, or class F. When operating in different classes, power stage amplifier 154 generally exhibits different tradeoffs between linearity and efficiency. Bias and match controller 134 can bias power stage amplifier 154 using any method known in the art. For example, bias and match controller 134 can vary a bias current and/or bias voltage supplied to power stage amplifier 154, or can provide a switching signal where power stage amplifier 154 is a variable class amplifier. Power stage amplifier 154 may be an operational amplifier and may comprise bipolar transistors and/or field effect transistors, or may be any other type of amplifier known in the art.

Bias and match controller 134 can bias power stage amplifier 154 to operate in one of several amplifier classes corresponding to a selected wireless communication standard. For example, power amplifier module 132 can amplify RF signals in wireless communications associated with a Wireless Local Area Networks (WLANs) standard or wireless communications associated with a Long Term Evolution-Unlicensed (LTE-U) standard. When the selected wireless communication standard is a WLAN standard, bias and match controller 134 can bias power stage amplifier 154 to operate in class A or in class AB. When the selected wireless communication standard is an LTE-U standard, bias and match controller 134 can bias power stage amplifier 154 to operate in class E or in class F. In various implementations, the selected wireless communication standard can be an LTE ("Long Term Evolution") standard, a 4G ("Fourth Generation") standard, a 5G ("Fifth Generation") standard, or any other communication standard. In various implementations, power stage amplifier 154 can operate in any other classes.

Bias and match controller 134 is also coupled to pre-driver amplifier 142 and to driver amplifier 148. In various implementations, pre-driver amplifier 142 and driver amplifier 148 may be operational amplifiers and may comprise bipolar transistors and/or field effect transistors, or may be any other type of amplifiers known in the art. In the present implementation, bias and match controller 134 maintains a constant bias for pre-driver amplifier 142 and driver amplifier 148. However, in various implementations, bias and match controller 134 can bias pre-driver amplifier 142 and/or driver amplifier 148 to operate in one of several amplifier classes.

Bias and match controller 134 is also coupled to heating elements 106a. 106b. 106c, and 106d of respective PCM RF switches 130a, 130b, 130c, and 130d. As described above, bias and match controller 134 provides electrical pulses to heating elements 106a. 106b, 106c, and 106d in order to switch respective PCM RF switches 130a, 130b, 130c, and 130d between ON and OFF states. Bias and match controller 134 is configured to use PCM RF switches 130a and 130b to couple power stage amplifier output 155 to either selectable matching network 156a or 156b. Bias and match controller 134 is also configured to use PCM RF switches 130c and 130d to couple either selectable matching network 156a or 156b to power amplifier module output 158. With proper electrical pulses from bias and match controller 134, either of selectable matching networks 156a or 156b can be coupled to provide an impedance match and/or to reduce harmonics between power stage amplifier output 155 and power amplifier module output 158.

Selectable matching networks 156a and 156b can have any designs known in the art. For example, selectable matching networks 156a and 156b can includes inductors, capacitors, and/or resistors having various values and various arrangements. However, in the present implementation, selectable matching networks 156a and 156b have different designs than one another.

For example, selectable matching network 156a can be designed to provide an impedance match between power stage amplifier output 155 and power amplifier module output 158 when power stage amplifier 154 operates in class A or in class AB and/or when the selected wireless communication standard is the WLAN standard. Selectable matching network 156b can be designed to provide an impedance match between power stage amplifier output 155 and power amplifier module output 158 when power stage amplifier 154 operates in class E or in class F and/or when the selected wireless communication standard is the LTE-U standard. Because harmonics are a particular concern for class E and class F amplifiers, in this example, selectable matching network 156b can also be designed to reduce harmonics. Thus, selectable matching networks 156a and 156b can correspond to different classes of operation of power stage amplifier 154 and/or to different wireless communication standards. In various implementations, power amplifier module 132 can include more or fewer selectable matching networks than shown in FIG. 2. In various implementations, the selected wireless communication standard can be an LTE standard, a 4G standard, a 5G standard, or any other communication standard.

By using power stage 152 having power stage amplifier 154, PCM switches 130a and 130b, and selectable matching networks 156a and 156b, power amplifier module 132 can, with low insertion loss, produce amplified RF signals at power amplifier module output 158 in different communication standards. First, because bias and match controller 134 biases power stage amplifier 154 to operate in one of several amplifier classes, power stage amplifier 154 can be tailored to operate according to requirements to a selected wireless communication standard. For example, a WLAN communication standard employs a modulation scheme that generally requires high linearity. Class E and class F amplifiers generally have relatively high efficiency but relatively low linearity. Conversely, class A and class AB amplifiers generally have relatively low efficiency but relatively high linearity. Thus, bias and match controller 134 would bias power stage amplifier 154 in class A or class AB mode of operation to cause power stage amplifier 154 to operate as a relatively linear amplifier suitable for the WLAN communication standard. On the other hand, an LTE-U standard has less strict linearity requirement and a higher efficiency requirement, and biasing power stage amplifier 154 to operate in class E or in class F may be more suitable in LTE-U applications due to the higher efficiency.

Second, because bias and match controller 134 uses PCM RF switches 130a and 130b to couple power stage amplifier output 155 to, or decouple power stage amplifier output 155 from, selectable matching networks 156a and 156b, the selectable matching network seen between power stage amplifier output 155 and power amplifier module output 158 can be tailored to a selected wireless communication standard. For example, in a WLAN standard, bias and match controller 134 can use PCM RF switches 130a and 130b to couple selectable matching network 156a and to decouple selectable matching network 156b. Selectable matching network 156a can provide an impedance match when power stage amplifier 154 operates in class A or in class AB. In an LTE-U standard, bias and match controller 134 can use PCM RF switches 130a and 130b to decouple selectable matching network 156a and to couple selectable matching network 156b. Selectable matching network 156b can provide an impedance match and reduce harmonics when power stage amplifier 154 operates in class E or in class F. Moreover, selectable matching networks 156a and 156b can have distinct and optimized designs that improve performance for a corresponding wireless communication standard.

Third, because power amplifier module 132 utilizes PCM RF switches 130a and 130b, it advantageously exhibits lower insertion loss, lower power consumption, and non-volatility compared to a power amplifier module using conventional switches. For example, at a frequency of about 5.0 GHz, an insertion loss of PCM RF switch 130a or 130b may be less than or approximately equal to 0.2 decibels. In contrast, an insertion loss of a conventional switch may be approximately 0.6 decibels. Thus, using conventional switches renders the power amplifier module inoperable due to high insertion losses. Power amplifier module 132 also enables non-volatile applications for RF filtering. For example, a communications device including power amplifier module 132 can couple selectable matching network 156a corresponding to a WLAN protocol prior to sale of the communications device in order to pre-program power amplifier module 132, while also maintaining the ability to couple selectable matching network 156b corresponding to an LTE-U protocol later on. As another example, PCM RF switch 130a can remain in a conductive state while the communications device is powered off, so selectable matching network 156a is already coupled prior to powering on the communications device.

Figure 3A:
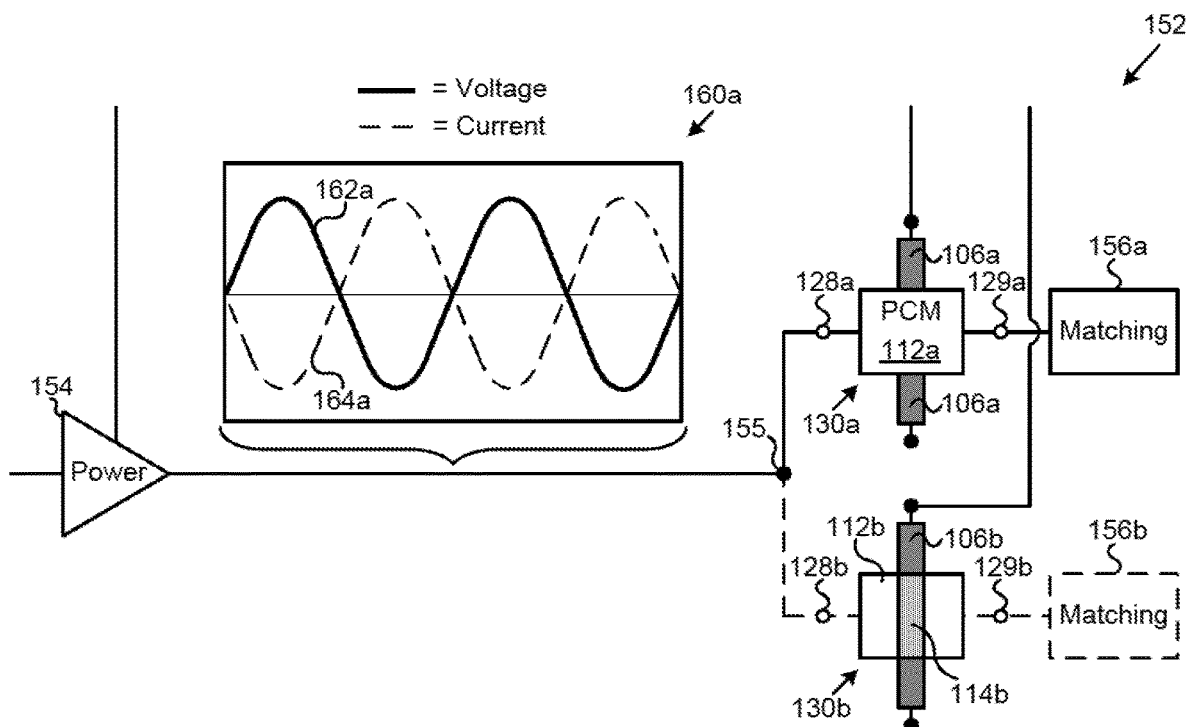
FIGS. 3A and 3B illustrate a portion of a power stage employing PCM RF switches and a corresponding power stage amplifier output graph according to one implementation of the present application.
Figure 3B:
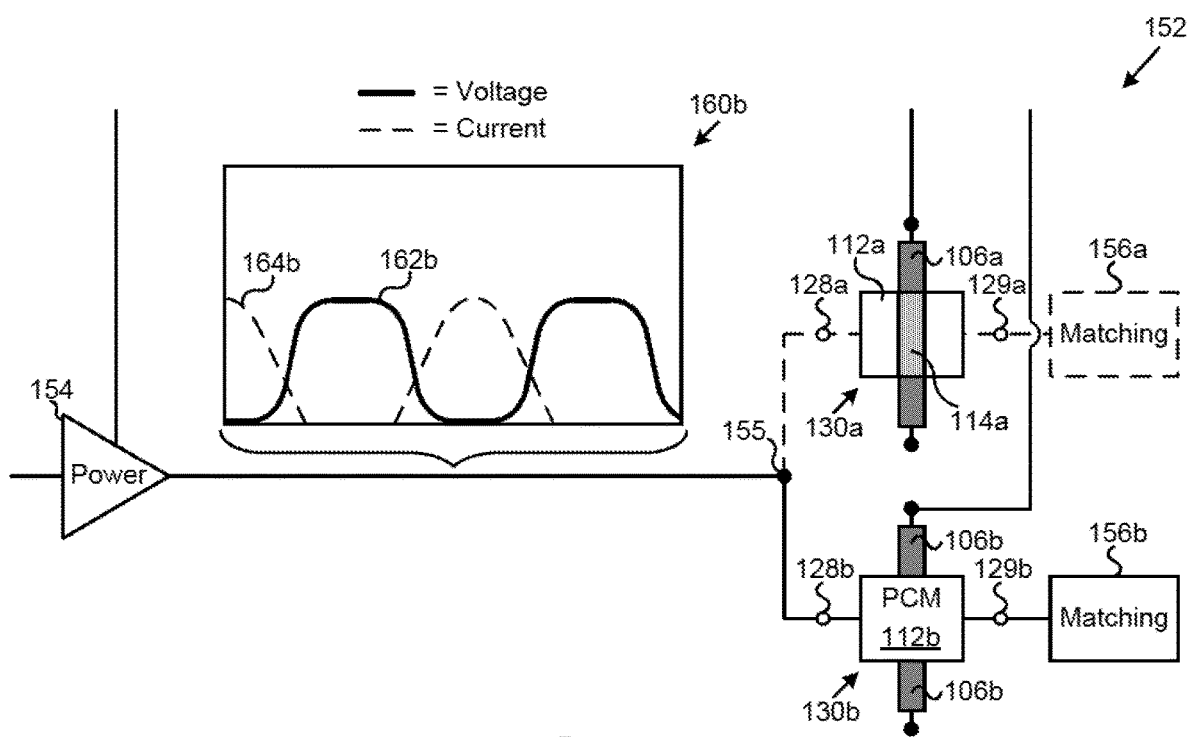

FIGS. 3A and 3B illustrate a portion of a power stage employing PCM RF switches and a corresponding power stage amplifier output graph according to one implementation of the present application. In FIG. 3A, power stage 152 may correspond to a first selected communication standard, such as a WLAN standard. In FIG. 3B, power stage 152 may correspond to a second selected communication standard, such as an LTE-U standard. Power stage 152 in FIGS. 3A and 3B includes power stage amplifier 154, power stage amplifier output 155, PCM RF switches 130a and 130b, and selectable matching networks 156a and 156b. Power stage 152 in FIGS. 3A and 3B generally corresponds to power stage 152 in FIG. 2. It is noted that power stage amplifier output graphs 160a and 160b are merely exemplary, and are not intended to correspond to actual values; accordingly, no units or scales are provided.

In FIG. 3A, power stage 152 may correspond to a first selected communication standard, such as a WLAN standard. To achieve linearity suitable for the WLAN standard, power stage amplifier 154 has been biased to operate in class A, for example, by bias and match controller 134 in FIG. 2. Power stage amplifier output graph 160a in FIG. 3A illustrates voltage trace 162a and current trace 164a seen at power stage amplifier output 155, in response to a sinusoidal input. Voltage trace 162a and current trace 164a are generally sinusoidal, out of phase from each other, swinging positive and negative. Power stage amplifier 154 remains conducting at all times, and is generally relatively inefficient. Voltage trace 162a and current trace 164a are characteristic of power stage amplifier 154 operating in class A.

In FIG. 3A, PCM RF switch 130a is in an ON state. PCM 112a is in a crystalline phase, has low resistivity, and is able to easily conduct electrical current. A signal at power stage amplifier output 155 propagates across PCM RF switch 130a through PCM contact 128a, PCM 112a, and PCM contact 129a, to selectable matching network 156a. Accordingly, power stage amplifier output 155 is coupled to selectable matching network 156a.

In FIG. 3A, PCM RF switch 130b is in an OFF state. Active segment 114b of PCM 112b is in an amorphous phase, has high resistivity, and does not easily conduct electrical current. A signal at power stage amplifier output 155 does not propagate across PCM RF switch 130b through PCM contact 128b, PCM 112b, and PCM contact 129b, to selectable matching network 156b. Accordingly, power stage amplifier output 155 is decoupled from selectable matching network 156b, as illustrated with dashed lines in FIG. 3A.

When selectable matching network 156a is coupled and selectable matching network 156b is decoupled as shown in FIG. 3A, selectable matching network 156a provides an impedance match corresponding to power stage amplifier 154 operating in class A. Thus, power stage 152 in FIG. 3A may be suited for a first selected communication standard, such as a WLAN standard.

In FIG. 3B, power stage 152 may correspond to a second selected communication standard, such as an LTE-U standard. Because the LTE-U standard has less strict linearity requirements, power stage amplifier 154 has been biased to operate in class F, for example, by bias and match controller 134 in FIG. 2. Power stage amplifier output graph 160b in FIG. 3B illustrates voltage trace 162b and current trace 164b seen at power stage amplifier output 155, in response to a sinusoidal input. Voltage trace 162b is generally square, swinging positive, with periods of zero voltage. Current trace 164b is roughly half-sinusoidal, swinging positive, with periods that generally exhibit either zero current in current trace 164b or zero voltage in voltage trace 162b. Power stage amplifier 154 is thus highly efficient due to a significant reduction of power consumption. Voltage trace 162b and current trace 164b are characteristic of power stage amplifier 154 operating in class F.

In FIG. 3B, PCM RF switches 130a and 130b have changed states. Heating element 106a has generated an amorphizing heat pulse, for example, in response to an electrical pulse from bias and match controller 134 in FIG. 2. Active segment 114a of PCM 112a has transformed from a crystalline phase to an amorphous phase that does not easily conduct electrical current. PCM RF switch 130a in FIG. 3B is in an OFF state. Accordingly, power stage amplifier output 155 is decoupled from selectable matching network 156a, as illustrated with dashed lines in FIG. 3B.

Conversely, heating element 106b has generated a crystallizing heat pulse, for example, in response to an electrical pulse from bias and match controller 134 in FIG. 2. Active segment 114b of PCM 112b has transformed from an amorphous phase to a crystalline phase that is able to easily conduct electrical current. PCM RF switch 130b in FIG. 3B is in an ON state. Accordingly, power stage amplifier output 155 is coupled to selectable matching network 156b.

When selectable matching network 156b is coupled and selectable matching network 156a is decoupled as shown in FIG. 3B, selectable matching network 156b provides an impedance match and also reduces harmonics corresponding to power stage amplifier 154 operating in class F. Thus, power stage 152 in FIG. 3B may be suited for a second selected communication standard, such as an LTE-U standard.

Figure 4:
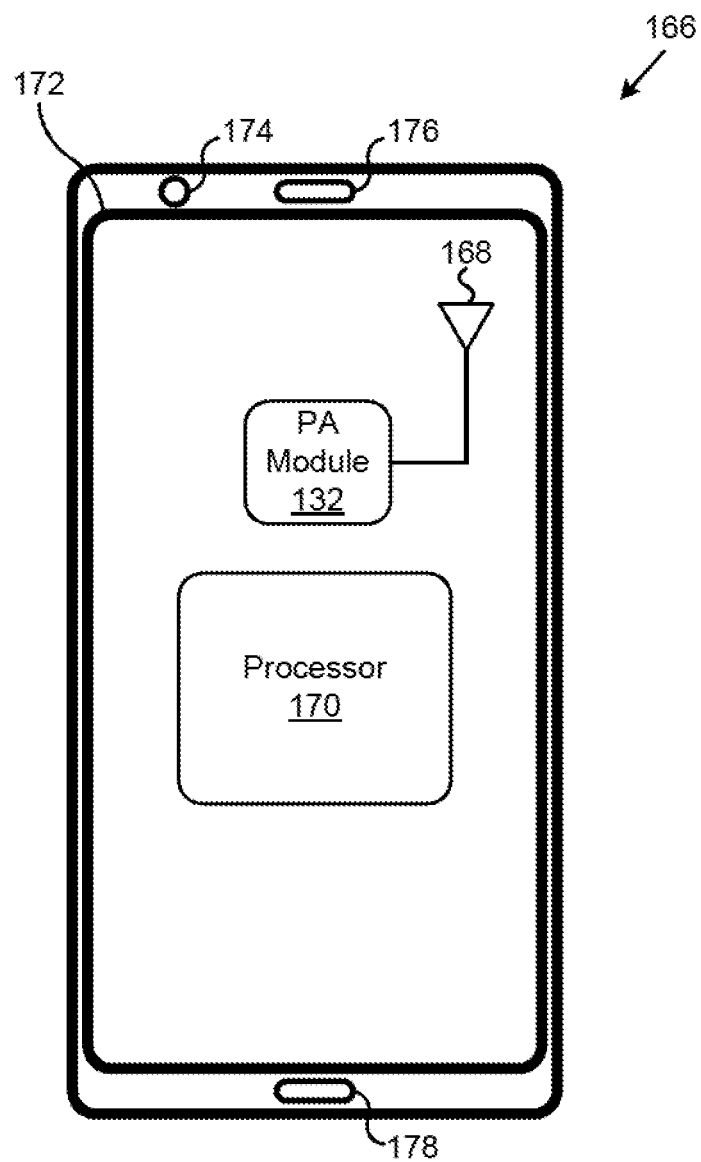
FIG. 4 illustrates a portion of a communications device including a power amplifier module according to one implementation of the present application.

FIG. 4 illustrates a portion of a communications device including a power amplifier module according to one implementation of the present application. Communications device 166 includes power amplifier module 132, antenna 168, processor 170, display 172, camera 174, speaker 176, and microphone 178. In the present implementation, communications device 166 is a mobile phone. In various implementations, communications device 166 may be any device that utilizes amplified signals.

Antenna 168 is coupled to power amplifier module 132. Antenna 168 in FIG. 4 can be coupled to power amplifier module output 158 in FIG. 2. Antenna 168 can transmit an amplified RF signal from power amplifier module 132. In one implementation, power amplifier module 132 can be coupled to an antenna array, rather than a single antenna 168. In one implementation, a receive/transmit block can be arranged between power amplifier module 132 and antenna 168, in order to switch communications device 166 between receive and transmit modes. Power amplifier module 132 in FIG. 4 generally corresponds to power amplifier module 132 in FIG. 4, and may have any implementations and advantages described above.

Communications device 166 includes processor 170. Processor 170 is a hardware processor, such as a central processing unit (CPU) used in computing devices. Processor 170 in FIG. 4 can determine signals to be input to power amplifier module input 136 in FIG. 2. In one implementation, processor 170 can be coupled to power amplifier module 132, for example, coupled to bias and match controller 134 in FIG. 2, for providing control signals.

Display 172 may be a liquid crystal display (LCD), an organic light emitting diode (OLED) display, or any other type of display. In one implementation, display 172 is also an input interface, such as a capacitive touchscreen LCD. Camera 174 may be a digital camera for taking photographs and/or video. Speaker 176 may be a micro-electro-mechanical systems (MEMS) speaker or an array of MEMS speakers for producing sounds. Microphone 178 may be a MEMS microphone or an array of MEMS microphones for detecting sounds. Display 172, camera 174, speaker 176, and microphone 178 can be coupled to processor 170. Communications device 166 can include other components not shown in FIG. 4.

By using power amplifier module 132, communications device 166 can provide amplified RF signals using power stage amplifier 154 (shown in FIG. 2) operating in a class optimized for a selected wireless communication standard, and using selectable matching networks 156a and 156b (shown in FIG. 2) optimized for the selected wireless communication standard. Moreover, because power amplifier module 132 utilizes PCM RF switches 130a and 130b (shown in FIG. 2), power amplifier module 132 advantageously exhibits lower insertion loss, lower power consumption, and non-volatility compared to a power amplifier module using conventional switches, as described above.

Thus, various implementations of the present application achieve an RF power stage utilizing the inventive PCM RF switch of the present application and novel combinations to overcome the deficiencies in the art to optimize amplification of RF signals for a selected communication standard, lower insertion loss, lower power consumption, and to provide non-volatility. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:
1. A power stage comprising:
a power stage amplifier;
a plurality of selectable matching networks;
a plurality of phase-change material (PCM) radio frequency (RF) switches, each of said plurality of PCM RF switches comprising a heating element transverse to a PCM, said heating element approximately defining an active segment of said PCM;
a power stage amplifier output being connected to said plurality of PCM RF switches, each of said plurality of PCM RF switches being connected to at least one of said plurality of selectable matching networks;

said power stage amplifier output coupled to or decoupled from one of said plurality of selectable matching networks by at least one of said plurality of PCM RF switches.

2. The power stage of claim 1, wherein said power stage amplifier operates in a class selected from the group consisting of class A, class AB, class E, and class F.

3. The power stage of claim 1, wherein said one of said plurality of selectable matching networks provides an impedance match when said power stage amplifier operates in class A or in class AB.

4. The power stage of claim 1, wherein said one of said plurality of selectable matching networks provides an impedance match and reduces harmonics when said power stage amplifier operates in class E or in class F.

5. The power stage of claim 1, wherein said one of said plurality of selectable matching networks corresponds to a selected wireless communication standard.

6. The power stage of claim 5, wherein said selected wireless communication standard is selected from the group consisting of a WLAN standard, an LTE standard, and LTE-U standard, a 4G standard, and a 5G standard.

7. The power stage of claim 1, wherein said PCM is selected from the group consisting of germanium telluride ($Ge_X Te_Y$), germanium antimony telluride ($Ge_X Sb_Y Te_Z$), germanium selenide ($Ge_X Se_Y$), and any other chalcogenide.

8. The power stage of claim 1, wherein an insertion loss of said at least one of said plurality of PCM RF switches is less than or approximately equal to 0.2 decibels.

9. The power stage of claim 1, wherein said power stage amplifier output is coupled to said one of said plurality of selectable matching networks when said active segment of said PCM in said at least one of said plurality of PCM RF switches is in a crystalline phase, and wherein said power stage amplifier output is decoupled from said one of said plurality of selectable matching networks when said active segment of said PCM in said at least one of said plurality of PCM RF switches is in an amorphous phase.

10. A communications device including a power amplifier module, said power amplifier module comprising:
  a bias and match controller;
  a power stage comprising:
    a power stage amplifier;
    a plurality of selectable matching networks;
    a plurality of phase-change material (PCM) radio frequency (RF) switches;
    a power stage amplifier output being connected to said plurality of PCM RF switches, each of said plurality of PCM RF switches being connected to at least one of said plurality of selectable matching networks;
  said bias and match controller configured to bias said power stage amplifier, and to use one of said plurality of PCM RF switches to couple said power stage amplifier output to one of said plurality of selectable matching networks or to decouple said power stage amplifier output from said one of said plurality of selectable matching networks.

11. The communications device of claim 10, wherein each of said plurality of PCM RF switches comprises a heating element transverse to a PCM, said heating element approximately defining an active segment of said PCM.

12. The communications device of claim 11, wherein said bias and match controller is coupled to said heating element in said at least one of said plurality of PCM RF switches.

13. The communications device of claim 11, wherein said power stage amplifier output is coupled to said one of said plurality of selectable matching networks when said active segment of said PCM in said at least one of said plurality of PCM RF switches is in a crystalline phase, and wherein said power stage amplifier output is decoupled from said one of said plurality of selectable matching networks when said active segment of said PCM in said at least one of said plurality of PCM RF switches is in an amorphous phase.

14. The communications device of claim 10, further comprising another plurality of PCM RF switches for connecting said plurality of selectable matching networks to a power amplifier module output.

15. The communications device of claim 10, further comprising a pre-driver stage and a driver stage for driving said power stage.

16. The communications device of claim 10, wherein said power stage amplifier operates in a class selected from the group consisting of class A, class AB, class E, and class F.

17. The communications device of claim 10, wherein said one of said plurality of selectable matching networks corresponds to a selected wireless communication standard.

18. The communications device of claim 10, wherein said PCM is selected from the group consisting of germanium telluride ($Ge_X Te_Y$), germanium antimony telluride ($Ge_X Sb_Y Te_Z$), germanium selenide ($Ge_X Se_Y$), and any other chalcogenide.

19. The communications device of claim 10, wherein an insertion loss of said at least one of said plurality of PCM RF switches is less than or approximately equal to 0.2 decibels.

20. The communications device of claim 10, wherein said communications device further comprises an antenna coupled to said power amplifier module.

* * * * *